United States Patent [19]

Bruel

[11] Patent Number: 4,536,657

[45] Date of Patent: Aug. 20, 1985

[54] PROCESS AND APPARATUS FOR OBTAINING BEAMS OF PARTICLES WITH A SPATIALLY MODULATED DENSITY

[75] Inventor: Michel Bruel, Veurey-Voroize, France

[73] Assignee: Commissariat a l'Energie Atomique, Paris, France

[21] Appl. No.: 558,950

[22] Filed: Dec. 7, 1983

[30] Foreign Application Priority Data

Dec. 8, 1982 [FR] France ................. 82 20564

[51] Int. Cl.³ ............... H01J 37/302; H01J 37/317; H01J 27/24; G21K 1/00
[52] U.S. Cl. .................. 250/492.2; 250/423 P; 250/251; 250/492.3
[58] Field of Search ............ 250/492.2, 492.3, 423 P, 250/251

[56] References Cited

U.S. PATENT DOCUMENTS 3,551,213 12/1970 Boyle et al. .................... 148/1.5
3,914,655 10/1975 Dreyfus et al. ................ 250/423 P
4,074,139 2/1978 Pankove ....................... 250/492.2

OTHER PUBLICATIONS

Vriens et al., "Excitation to the Metastable States...", *Physica* 40 (1968), pp. 229, 232, 233.

Primary Examiner—Bruce C. Anderson
Assistant Examiner—Jack I. Berman
Attorney, Agent, or Firm—Michael N. Meller

[57] ABSTRACT

Process and apparatus for obtaining beams of particles having a spatially modulated density, application to ion implantation and etching.

For example, the invention consists of passing the particles of one beam into a long life excited state, selectively ionizing the excited particles with the aid of light having an adequate energy and spatially modulated intensity directed onto the excited particles, and separating the ionized particles from the particles which have remained excited, so as to obtain a beam of excited particles and a beam of ionized particles having a spatially modulated density.

17 Claims, 9 Drawing Figures

PROCESS AND APPARATUS FOR OBTAINING BEAMS OF PARTICLES WITH A SPATIALLY MODULATED DENSITY

BACKGROUND OF THE INVENTION

The present invention relates to a process and an apparatus for obtaining beams of particles having a spatially modulated density. It more particularly applies to ionic etching and in particular fine and localized etching, in the field of microelectronics, as well as to ion implantation and more specifically localized doping with the aid of such an implantation.

The term "particles" is understood to mean atoms, groups of atoms, molecules, negative ions and positive ions.

The term "beam of particles having a spatially modulated density", is understood to mean a beam of particles for which the density of the particles, in a given cross-section of said beam, is dependent on the considered point of said section. It is possible to have an "all or nothing" spatial modulation or a discontinuous spatial modulation, i.e. a spatial modulation for which any cross-section of the beam is formed from regions containing particles and which are separated from one another. It is also possible to have a continuous spatial modulation, i.e. a spatial modulation for which the density of the particles, in any cross-section of the beam, varies in a continuous manner between the individual points of said section.

A method is known for obtaining a beam of particles having a spatially modulated density, which consists of passing the beam through a reticular or latticed mask, the beam then being focused, when required by the envisaged application. The latticed mask can be constituted by a plate perforated by openings of an adequate size, then giving a discontinuous modulation, or can be constituted by a plate whose absorption for the incident beam varies as a function of the considered point on the plate, then giving an analog spatial modulation.

This method has the disadvantage of making it impossible to realise certain modulations. In addition, the latticed mask used in this method is rapidly deteriorated by the incident particle beam.

Another method is known for obtaining a beam of particles having a spatially modulated density, which consists of rapidly scanning a given portion of the space by means of a fine beam, whilst modulating the intensity of the beam as a function of time, so as to obtain the desired spatial modulation in the space portion scanned by the beam. This other method has the disadvantage of taking a long time and of requiring the formation of a perfectly controlled, fine beam.

SUMMARY OF THE INVENTION

The object of the present invention is to obviate the disadvantages of the aforementioned methods and is directed at a process and an apparatus for obtaining a beam of particles also having a spatially modulated density.

The invention firstly relates to a process for obtaining beams of particles having a spatially modulated density, wherein it comprises passing the particles of a primary beam of particles in a first high-energy state $E_1$, so as to form the beam of particles in said first high-energy state $E_1$, selectively passing the particles in the first high-energy state $E_1$ to a second high-energy state $E_2$ with the aid of a light flux having a spatially modulated intensity, directed onto the beam of particles in said first high-energy state $E_1$, and separating the particles in the second high-energy state $E_2$ from particles in the first high-energy state $E_1$, so as to obtain a beam formed by particles in the first high-energy state $E_1$ and a beam formed from particles in the second high-energy state $E_2$, said beams being separate and having a spatially modulated density, wherein one of the said first and second high-energy states $E_1$ and $E_2$ is a long life high-energy state and wherein the other high-energy state is an ionized state, whose ionization state differs from that of the long life high-energy state.

Thus, the latter is preferably neutral or of an opposite sign to that of the ionized state, or can be of the same sign as the latter, but have a different ionization multiplicity from that of the ionized state (e.g. so as to be able to separate the beams of particles respectively in states $E_1$ and $E_2$ by an electrical and/or magnetic field).

Thus, a first embodiment of the process according to the invention comprises passing the particles of a primary beam of particles in a long life high-energy state, so as to form a beam of particles in said long life high-energy state, selectively passing the particles in said long life high-energy state to an ionized state, whose ionization state differs from that of the long life high-energystate, with the aid of a light flux of spatially modulated intensity, directed onto the beam of particles in said long life high-energy state, said light flux being formed by photons, whose energy is either at least equal to the difference between the energy of the ionized state and the energy of the long life high-energy state in the case of a direct transition, or adapted to the intermediate levels in the case of indirect transitions, and finally separating the particles in the ionized state from those remaining the long life high-energy state, so as to obtain a beam formed from particles in the ionized state and a beam formed from particles remaining in the long life high-energy state, said beams being separate and having a spatially modulated density.

In the case of this first embodiment, the term "long life high-energy state" is urderstood to mean a high-energy state, whose life is sufficient to ensure that the particles are still in this state at the time at which it is wished to selectively pass particles to said ionized state. Thus, a high-energy state, whose life exceeds 1 μs and is e.g. approximately a few dozen microseconds (approximately 20 to 50 μs) is suitable as a long life high-energy state.

According to a second embodiment, the process according to the invention comprises passing the particles of a first beam of particles to an ionized state, so as to form a beam of particles in said ionized state, selectively passing the particles in said ionized state to a long life high-energy state, whose ionization state differs from that of the ionized state, with the aid of a light flux having a spatially modulated intensity, directed onto the beam of particles in said ionized state, said light flux being formed from photons having an energy either at least equal to the difference between the energy of said long life high-energy state and the energy of the ionized state in the case of a direct transition, or adapted to intermediate levels in the case of an indirect transition, and separating the particles remaining the ionized state from the particles in the long life high-energy state, so as to obtain a beam formed from particles in the long life high-energy state and a beam formed from particles remaining in the ionized state, said beams being separate and having a spatially modulated density.

In the case of this second embodiment, the term "long life high-energy state" is understood to mean a high-energy state, whose life is sufficient to ensure that the particles are still in this state at the time at which it is wished to separate the particles from the particles remaining in the ionized state. "Ionized state of a particle" is understood to mean a state in which the particle has lost or gained one or more electrons.

The first and second embodiments are both characterized by the fact that two separate populations are produced within a beam, namely the particles in the ionized state and the particles in the long life high-energy state, the spatial modulation being produced as a result of the separation of these two populations. The difference between the first and second embodiments is solely that in the first embodiment the ionized state results from the light flux applied and in the second embodiment, the ionized state is the initial state and the long life high-energy state results from the application of the light flux.

Therefore, the total similarity of these two embodiments is apparent. For reasons of clarity, reference will consequently only be made hereinafter to the first embodiment, whereby it must be borne in mind that the corresponding conclusions can be drawn with respect to the second embodiment.

It is possible to use as the light flux, one or more light beams striking the beam of particles in the long life high-energy state at different locations thereof, or at the same location but in different directions. The intensity of a light beam can be continuously spatially modulated, i.e. varying in a continuous manner between individual points of a cross-section of the light beam. However, it can also be discontinuously spatially modulated, any cross-section of the light beam then being formed from separate regions, outside which the light intensity is zero.

The modulation of the intensity of an incident light flux on the beam of particles in the long life high-energy state leads to a spatial modulation of the density of said particle beam. Under the action of the photons of the light flux, certain particles pass to the ionized state, whilst others not reached by the photons remain in the long life high-energy state. This is followed by the sorting of the particles in order to form a particle beam in the ionized state and another particle beam in the long life high-energy state. It is then possible to use one or other of these two beams having a spatially modulated density, or also both of them. Obviously, the beam of particles remaining in the long life high-energy state can include particles which have dropped back to their normal state, the life not being infinite. Moreover, it is possible to repeat the process according to the invention on the beam of particles remaining in the long life high-energy state, whilst ionizing certain of these and separating others. It should also be noted that the modulation of the intensity of the light flux is determined as a function of the desired spatial modulation for the density of the particle beam in the ionized state or for the density of the particle beam remaining in the long life high-energy state.

The present invention offers the following advantages. The use of long life high-energy states makes it possible to obtain in an easy manner a two-stage ionization (bringing into said long life high-energy state and the actual ionization. Moreover, the choice of a long life high-energy state close to the ionized state makes it possible to use photons belonging to the visible or near ultraviolet spectrum for the ionization and consequently use conventional optical means for treating the light beam or beams used as the light flux. Finally, the modulation of the intensity of the light beam or beams leads directly to a spatial modulation of the particle beam in said long life high-energy state, so that it is possible to carry out with respect to said spatial modulation everything that can be performed in optical imaging or display.

Moreover, in the case of the invention, there is no problem of a deterioration of a mask by a particle beam, because no mask is used. In addition, the present invention makes it possible to rapidly obtain a beam with a spatially modulated density from a beam, which neither has to be perfectly controlled, nor fine.

According to a preferred feature of the process according to the invention, the long life high-energy state is a metastable excited state. Thus, an excited state of a particle, such as e.g. an atom, whose transition to another excited state or to a normal state is authorized by the selection rules of dipole radiation, has a very short life. Conversely, a metastable excited state, whose transition is not authorized has a much longer life than that indicated hereinbefore and can exceed 1 s, namely $10^5$ s, as a function of the considered atom.

It is possible to pass directly from the normal state of a particle to a metastable state by electron or photon collision, electrons being more effective than photons. This metastable state can also be reached from a radiative state, whose deexcitation leads to the metastable state through a sequence of radiative transitions.

According to a special feature of the process according to the invention, the particles of the primary beam are electrically neutral and in their normal state and said particles are passed to the metastable excited state from their normal state by electron bombardment (said first high-energy state $E_1$ being constituted by the metastable excited state, whilst the second high-energy state $E_2$ is then the ionized state).

According to another special feature, the particles of the primary beam are electrically charged and these particles are passed to the metastable excited state by electron bombardment, after neutralizing the particles of the primary beam by charge exchange in a gas of particles of the same type (the first high-energy state $E_1$ being constituted by the metastable excited state and the second high-energy state $E_2$ then being the ionized state). The interest of using a primary beam of charged particles results from the fact that such particles can be accelerated prior to the spatial modulation of the beam.

According to another special feature, the ionized state is the first ionization state.

According to another special feature, the particles in said ionized state are separated from the particles in said long life high-energy state with the aid of at least one of the fields included in the group consisting of electric fields and magnetic fields.

According to another special feature, the intensity of the light flux is spatially modulated by passing the light flux through an optical mask, called simply a "mask" for short.

According to another special feature, the spatial modulation of the light flux intensities obtained by a method based on the undulatory nature of light, e.g. by interferometry or holography.

According to another special feature, the modulated intensity light flux is obtained by directing towards the axis of the particle beam in the first high-energy state $E_1$, two beams of coherent light from the same primary light beam, whereby this takes place in a symmetrical manner with respect to the axis of the particle beam in said first high-energy state $E_1$, so as to obtain in this way alternate light and dark areas parallel to the axis of the particle beam in said first high-energy state $E_1$.

According to another special feature, the particles are atoms of at least one rare gas. The following table indicates the metastable state of certain rare gases, their energy $E_m$ expressed in eV, their life T expressed in seconds and, for each rare gas atom, the first ionization energy $E_i$ expressed in eV, the differences $E_i - E_m$ (in eV) and the wavelength $\lambda$ expressed in $\mu$m of the photons permitting transitions from the metastable states to the first ionization state or level.

TABLE

| Rare gas | Normal state | Metastable states | $E_m$ | T | $E_i$ | $E_i - E_m$ | $\lambda$ |
|---|---|---|---|---|---|---|---|
| He | $1^1S_0$ | $2^3S_1$ | 19.82 | $6.10^5$ | 24.6 | 4.78 | 0.260 |
|  |  | $2^1S^o$ | 20.61 | $2.10^{-2}$ |  | 3.99 | 0.310 |
| Ne | $2^1S_0$ | $3^3P_2{}^o$ | 16.62 | 0.8 | 21.564 | 4.944 | 0.251 |
|  |  | $3^3P_o{}^0$ | 16.72 | 0.8 |  | 4.844 | 0.256 |
| A | $3^1S_0$ | $4^3P_2{}^0$ | 11.55 | 1.3 | 15.755 | 4.205 | 0.295 |
|  |  | $4^3P_0{}^0$ | 11.72 | 1.3 |  | 4.035 | 0.301 |
| Kr | $4^1S_0$ | $5^3P_2{}^0$ | 9.92 | 1 | 13.999 | 4.079 | 0.304 |
|  |  | $5^3P_0{}^0$ | 10.56 | 1 |  | 3.439 | 0.361 |
| Xe | $5^1S_0$ | $6^3P_2{}^0$ | 8.32 | Unknown | 12.129 | 3.809 | 0.326 |
|  |  | $6^3P_0{}^0$ | 9.45 | Unknown |  | 2.679 | 0.463 |

It should be noted that sources emitting photons of such wavelengths are known in the art. Moreover, the effective excitation cross-sections by photons of the metastable states of rare gases such as helium or argon, are also known in the art. For example, the effective excitation cross-section of the metastable states of argon by electrons, whose kinetic energy is 22 eV, is approximately $2.10^{-17}$ cm$^2$, which is a relatively high value. The effective ionization cross-sections of the metastable states of rare gases are also known in the art.

The present invention also relates to an apparatus for obtaining beams of particles having a spatially modulated density, wherein it comprises means for producing a primary particle beam, means for passing the particles of said primary beam to a first high-energy state $E_1$, so as to form a particle beam in said first high-energy state $E_1$, means of producing a light flux formed from photons able to pass the particles in the first high-energy state $E_1$ to a second high-energy state $E_2$, and for directing this light flux onto the particle beam in the first high-energy state $E_1$, means for spatially modulating the intensity of the light flux, interposed between the means for producing and directing said light flux and the particle beam in the first high-energy state $E_1$, so as to selectively pass the particles in the first high-energy state $E_1$ to the second high-energy state $E_2$, and means for separating the particles in the second high-energy state $E_2$ from the particles in the first high-energy state $E_1$, so as to obtain a beam formed from particles in the first high-energy state $E_1$ and a beam formed from particles in the second high-energy state $E_2$, said beams being separate and having a spatially modulated density, one of the first and second high-energy states $E_1$ and $E_2$ being a long life high-energy state and the other high-energy state being an ionized state, whose ionization state differs from that of the long life high-energy state.

According to a first embodiment, the apparatus according to the invention comprises: means for producing a primary particle beam, means for passing the particles of said primary beam to a long life high-energy state, so as to form a particle beam in said long life high-energy state means for producing a light flux formed from photons able to ionize the particles in said long life high-energy state and for directing this light flux onto the particle beam in said long life high-energy state, means for spatially modulating the intensity of said light flux, interposed between the means for producing and directing the light flux and the particle beam in said long life high-energy state, so as to selectively pass the particles in said long life high-energy state into an ionized state, and means for separating the particles in said ionized state from the particles remaining there in the long life high-energy state, so as to obtain a beam formed from particles in the ionized state and a beam formed from particles remaining in the long life high-energy state, said beams being separate and having a spatially modulated density, the ionized state having an ionization state differing from that of the long life high-energy state.

The first embodiment of the apparatus according to the invention corresponds to the first embodiment of the process according to the invention.

According to a special embodiment, the light flux is constituted by at least one light beam, which is directed towards the particle beam in the long life high-energy states and transversely with respect thereto.

According to another embodiment, the light flux is a light beam, whereby the latter and the particle beam are in the long life high-energy state, are colinear and have opposite propagation directions. The apparatus also successively comprises ionization means, acceleration means and means for deflecting the particle beam remaining in the high-energy state.

According to another embodiment, the light flux is a light beam, the particle beam in the long life high-energy state and the light beam propagating in the same direction and in opposite senses, wherein the particle beam in said long life high-energy state is rendered convergent in accordance with an angle $\alpha$, the light beam being rendered divergent according to the same angle $\alpha$ and also coincides with the particle beam in the long life high-energy state, and wherein the separation means comprise means for deflecting the particles in said ionized state. Preferably, the means for spatially modulating the intensity of the light beam consist of a mask, provided with patterns, whose size is such that these patterns only lead to a slight light diffraction. The convergence of the particle beam in the long life high-energy state then makes it possible to reduce the size of the "patterns" present in said beam following its modulation.

It is obviously possible for the Expert to work out an apparatus for performing the second embodiment of the process according to the invention.

BRIEF DESCRIPTION OF THE DRAWINGS

The invention is described hereinafter relative to non-limitative embodiments and with reference to the attached drawings, wherein show.

DETAILED DESCRIPTION OF THE INVENTION

Figure 1:
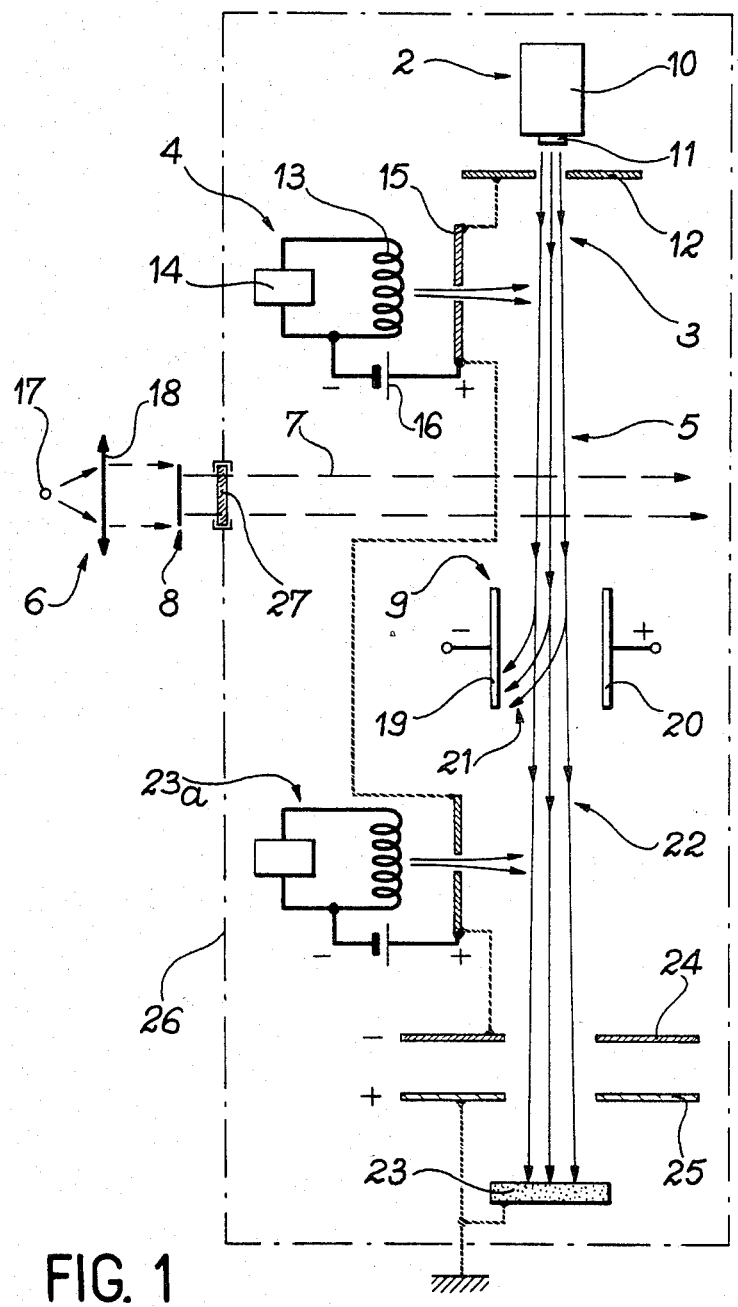
FIG. 1 a diagrammatic view of a special embodiment of the apparatus according to the invention.

FIG. 1 diagrammatically shows a special embodiMent of the apparatus according to the invention. It essentially comprises means 2 for producing a primary particle beam 3, means 4 for passing the particles of said primary beam 3 to a long life high-energy state, preferably a metastable excited state, so as to form a particle beam 5 in said metastable state, means 6 for producing a light beam 7 formed from photons able to ionize the particles in the metastable state and for directing the light beam 7 onto the particle beam 5 in the metastable state, means 8 for spatially modulating the intensity of light beam 7, interposed between means 6 for producing and directing the light beam 7 and the particle beam 5 in the metastable state, so as to selectively pass the particles in the metastable state into an ionized state, and means 9 for separating the particles in the ionized state from the particles remaining in the metastable excited state.

The particles of the primary beam 3 are, for example, electrically neutral atoms of a rare gas, such as helium. The means 2 for producing this primary beam 3 consist of a helium atom effusion source, having a gaseous helium reservoir 10, provided with a nozzle 11, and a collimator 12 for defining the primary helium atom beam 3.

The means 4 for passing the helium atoms in a metastable excited state, e.g. state $2^3 S_1$, consist of an electron source having an electron-emitting filament 13, when it is heated with the aid of a current generator 14, and a perforated electrode 15 which is to be traversed by electrons from filament 13. Electrode 15 is raised to a positive electrical potential of approximately 20 V relative to filament 13, by means of a d.c. voltage generator, so as to accelerate the electrons from filament 13. The electron source 4 is obviously oriented in such a way as to pass the accelerated electrons produced by it into the primary beam 3.

The means 6 for producing and directing the light beam 7 comprise a light source 17, which emits photons having a wavelength of 0.260 μm, followed by an optical system 18, so as to form light beam 7 and direct it perpendicularly to the helium atom beam 5 in the metastable state.

The means 8 for spatially modulating the intensity of light beam 7 are constituted by a mask, which will be described hereinafter. Finally, the separation means 9 consist of two deflection plates 19, 20, one being raised to a positive high voltage and the other to a negative high voltage.

The helium atoms from the effusion source 2 are consequently firstly excited by the electrons emitted by electron source 4 and pass to the metastable state. The photons from light beam 7 then selectively ionize these helium atoms in the metastable state. Certain of these metastable atoms become $He^+$ atoms, whilst the others remain in the metastable $He^*$ state, according to a configuration imposed by mask 8. After this, the ions $He^+$ and the metastable atoms $He^*$ pass between plates 19 and 20. The electrical field between these plates 19 and 20 deflects the $He^+$ ion, but not the $He^*$ metastable atoms. Thus, a $He^{30}$ ion beam 21 and a $He^*$ helium atom beam 22 are obtained, said beams 21 and 22 both having a spatially modulated intensity.

When it is wished to use the beam 22 of $He^*$ atoms remaining in the metastable state for e.g. carrying out the etching of an integrated circuit 23 or the implantation of ions in said circuit 23, it is possible to ionize the $He^*$ metastable atoms of beam 22 by electron bombardment by means of another electron source 23a, like electron source 4. This is followed by the acceleration of the ions formed by means of an electrical field created between two plates 24 and 25, perforated in order to permit the passage of the $He^+$ ions formed. The first plate 24 in the passage thereof, is raised to a negative potential of approximately e.g. 30 kV with respect to the following plate 25. Obviously, the integrated circuit 23 is positioned following the second plate 25, in the path of beam 22. It is also possible to use the $He^+$ ion beam 21 with the spatially modulated density for the same type of application, by appropriately accelerating said beam 21, following the deflection thereof by deflecting plates 19, 20.

In a manner known in the art, primary beam 3 is emitted in an enclosure 26, in which a vacuum is formed with the aid of not shown pumps, the pressure in enclosure 26 being e.g. approximately $10^{-4}$ Pa, whilst the electron bombardment by source 4, the irradiation by light beam 7, the separation of the $He^*$ metastable atoms from the $He^+$ ions, the electron bombardment by the other source 23a and the acceleration by plates 24 and 25 are obviously performed in enclosure 26, which also contains the integrated circuit 23 by acting as a target. To facilitate production and use, light source 17, optical system 18 and mask 8 can be positioned outside enclosure 26, the light from source 27 then passing enclosure 26 through an e.g. quartz porthole 27. In order that the $He^{30}$ ions are not exposed to floating electrical potentials, an electrical connection is formed between collimator 12 and the perforated electrode 15, between the latter and the homologous electrode of electron source 23a, between the homologous electrode and the first plate 24, and between the second plate 25 and circuit 23, the latter being earthed.

Figure 2:
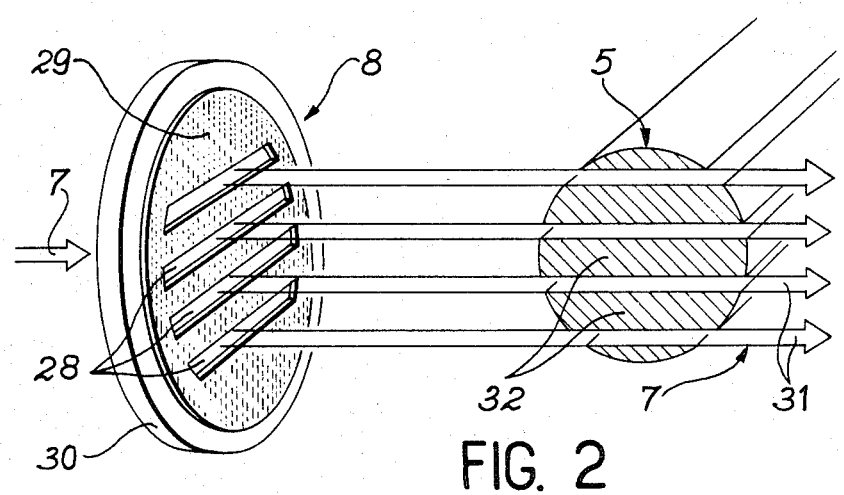
FIG. 2 a diagrammatic view of a mask for modulating the intensity of a light beam used in the apparatus according to FIG. 1.

FIG. 2 diagrammatically shows the mask 8. It has a plurality of longitudinal, parallel slots 28, which are e.g. rectangular and which are formed from a material 29 opaque to the light used, said material 29 being placed on a flat support 30, which is transparent to this light. Mask 8 is positioned in the path of light beam 7, perpendicular to the latter and oriented in such a way that slots 28 are parallel to beam 5 of $He^*$ helium atoms in the metastable state. On passing through mask 8, beam 7 is spatially modulated. It is subdivided into a plurality of parallel subbeams 31, which interact with the metastable He* atom beam 5, by ionizing the metastable He* atoms encountered during their passage. After eliminating the He+ ions by means of deflecting plates 19, 20 (FIG. 1), there then remains a metastable He* atom beam constituted by a plurality of longitudinal, parallel sections 32, whose sectional view is shown in hatched form in FIG. 2.

Figure 3A:
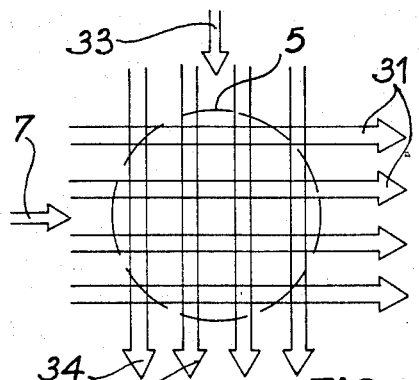
FIG. 3a diagrammatic view of the interaction of a particle beam used in the apparatus of FIG. 1 with two light beams with spatially modulated intensities.
Figure 3B:
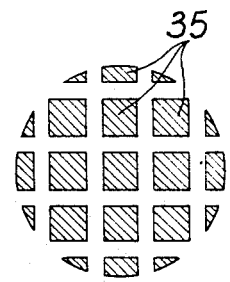
FIG. 3b a diagrammatic view of the cross-section of a beam of particles having a spatially modulated density obtained by means of said interaction.

In place of a single light beam, it is possible to use several such beams for carrying out other spatial modulations of the metastable He* atom beam 5. For example, it is possible to use another light beam 33 (FIG. 3a), whose intensity is modulated by a not shown mask, like mask 8 (FIG. 2), and which is emitted by not shown means, like means 6 (FIG. 1). The emission means and mask are arranged in such a way that the light beams 7 and 33 strike the beam 5 of metastable helium atoms perpendicular to the latter and in the same portion thereof (or in different portions) and namely e.g. perpendicular to one another. The masks are arranged in such a way that their slots are parallel to the beam 5 of metastable helium atoms. As explained hereinbefore, each light beam 7 or 33 is formed, after passing through the mask associated therewith, from subbeams 31 or 34. These subbeams ionize the He* metastable atoms encountered by them during their passage and, after eliminating the He+ ions formed, there remains a beam of He* metastable atoms having a spatially modulated density and constituted by a plurality of parallel, separate subbeams 35 (FIG. 3b), whereof the sectional view is hatched in FIG. 3b.

Figure 4:
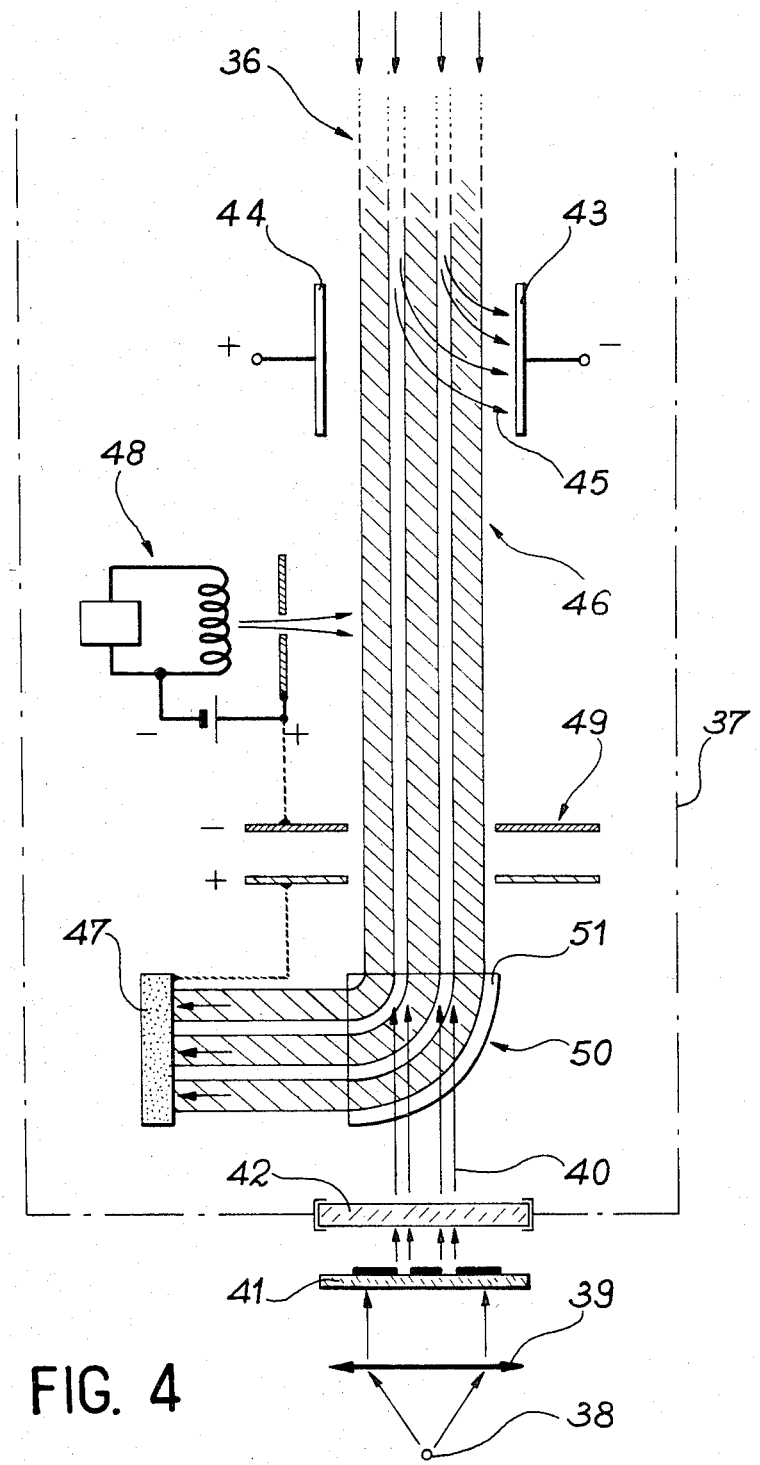
FIG. 4 a diagrammatic view of another special embodiment of the apparatus according to the invention.

FIG. 4 diagrammatically shows another embodiment of the apparatus according to the invention. The particles in question are once again e.g. helium atoms. The apparatus according to the invention in FIG. 4 comprises means for producing a beam 36 of helium atoms in a metastable state in an enclosure 37, in which a vacuum has been produced by means of not shown pumps, so as to obtain a pressure of approximately $10^{-4}$ Pa in enclosure 37. The means for producing the beam 36 of metastable helium atoms are not shown and are constituted by a helium atom effusion source and by an electron source, as described in conjunction with FIG. 1.

The apparatus according to the invention shown in FIG. 4 also has means constituted by a light source 38 and an optical system 39, respectively conforming to light source 17 and optical system 18 of FIG. 1, for forming a parallel light beam 40. Light source 38 and optical system 39 are arranged in such a way that the light beam 40 which is emitted is colinear to the beam 36 of metastable helium atoms, but propagates in the opposite sense to the latter, so that the two beams meet one another. A mask 41 is located in the path of light beam 40, in order to modulate the intensity of the latter before said light beam interacts with the metastable helium atom beam 36. To facilitate the production and use of the apparatus, light source 38, optical system 39 and mask 41 are positioned outside enclosure 37 and the light beam 40 enters the latter via an e.g. quartz porthole 42. As explained hereinbefore, certain helium atoms pass from the metastable state to the ionized state. The He+ ions obtained are deflected by means of deflecting plates 43, 44, positioned on either side of the metastable helium atom beam and are respectively exposed to a negative high voltage and a positive high voltage, thus forming a He+ ion beam 45, which can be optionally used, after acceleration, for an e.g. ion implantation.

Following deflecting plates 43, 44, a beam 46 of spatially modulated density is obtained, which is formed from helium atoms which, as they have not been reached by the photons of the light beam 40, remain in the metastable state. For example, they can be used for an ion implantation in an integrated circuit 47 used as a target, after being ionized by ionization means 48, e.g. constituted by a high-energy electron source, after which they are accelerated by acceleration means 49, such as an electrical field obtained with the aid of plates, like plates 24 and 25 of FIG. 1, between which is applied a voltage of e.g. approximately 30 kV. They are finally deflected in the direction of integrated circuit 47, as a result of deflection means 50, e.g. constituted by a magnet having two pole pieces, between which pass the ions intended for implantation and whereof only one, carrying reference numeral 51, is shown in FIG. 4. In order that the He+ ions are not exposed to floating electrical potentials, an electrical connection is produced between the perforated electrode equipping electron source 48 and the homologous plate of plate 24 (FIG. 1) and forming part of the acceleration means 49, and between the homologous plate of plate 25 (FIG. 1) and forming part of said means 49, as well as circuit 47.

Figure 5B:
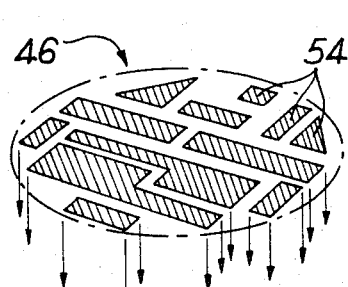
FIG. 5b a diagrammatic view of the cross-section of a beam of particles having a spatially modulated density, obtained as a result of said modulated intensity light beam.
Figure 5A:
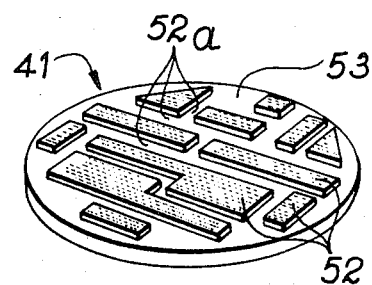
FIG. 5a a diagrammatic view of a mask for modulating the intensity of a light beam used in the apparatus of FIG. 4.

FIG. 5a diagrammatically shows a special embodiment of mask 41 of FIG. 4. It has a plurality of separate regions 52, which are formed from a material which is opaque to the light from source 38 (FIG. 4) and deposited on a support 53, which is transparent to said light. Thus, mask 41 has a plurality of opaque regions 52 separated by transparent regions 52a. On returning to FIG. 4, it can be seen that the "design" of mask 41, constituted by the group of opaque regions 52, is directly given to the metastable helium atom beam 36. The spatial modulation of beam 46, formed from helium atoms remaining in the metastable state is the exact image of mask 41. FIG. 5b shows a cross-section through beam 46 and which effectively has a plurality of separate regions 54, homologous to the region 52 of mask 41.

Figure 6:
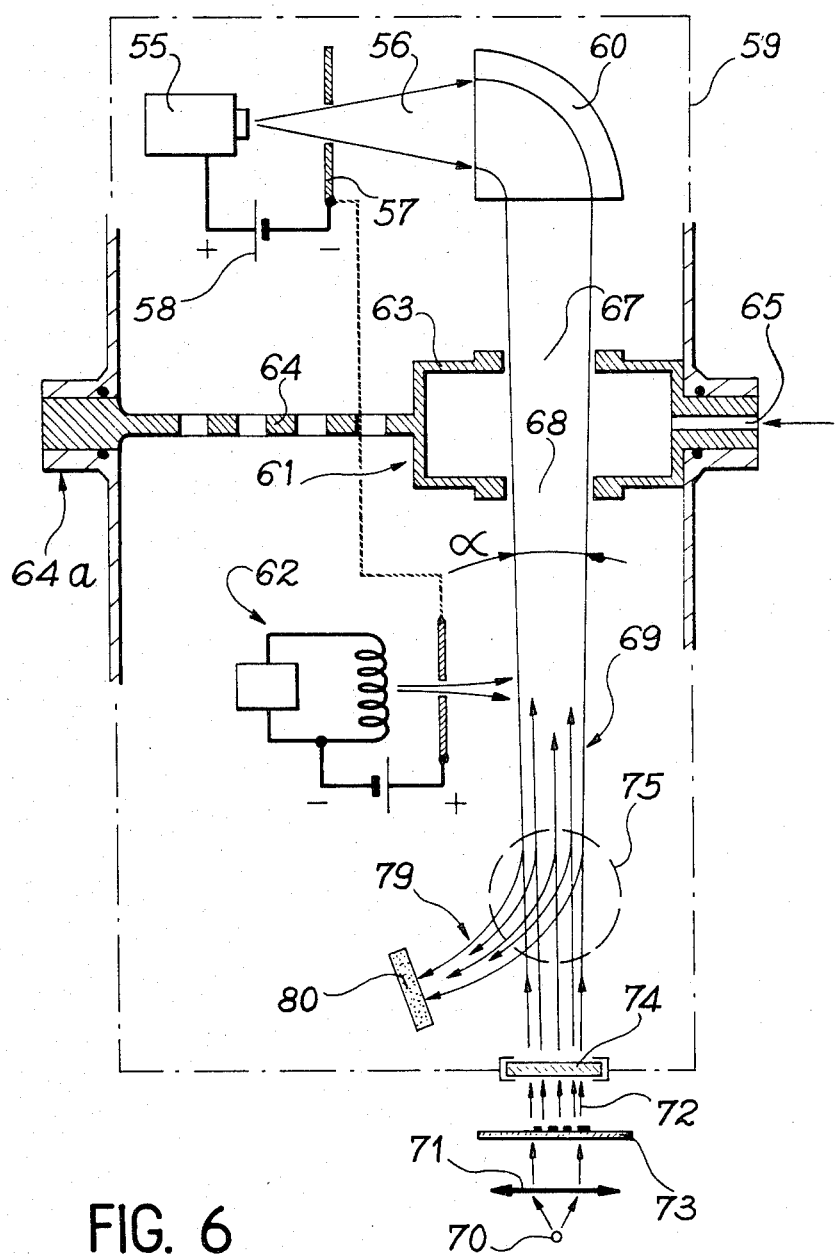
FIG. 6 a diagrammatic view of another embodiment of the apparatus according to the invention.

FIG. 6 diagrammatically shows another embodiment of the apparatus according to the invention, in which the particles are electrically charged. For example, they are helium atoms which have been ionized, i.e. He+ ions. The apparatus according to the invention shown in FIG. 6 has means 55 for producing a primary beam 56 of He+ ions, said means consisting of a per se known He+ ion source. The primary beam 56 is accelerated on leaving source 55, by a perforated electrode 57 for permitting the passage of primary beam 56 and raised to a negative potential, e.g. approximately 30 kV, with respect to the ion source 55, by means of a voltage generator 58. The primary beam 56 is obviously emitted in enclosure 59, in which the vacuum has been produced by means of not shown pumps, the residual helium pressure in the enclosure being e.g. approximately $10^{-4}$ Pa. The primary beam 56, which diverges on leaving ion source 55 is made convergent in accordance with an angle α, by a magnetic focusing field produced by a magnet, whereof one of the pole pieces 60 is shown in FIG. 6.

The apparatus according to the invention shown in FIG. 6 also has means for passing the He+ ions of primary beam 56 into the state of He* helium atoms in a metastable excited state, said means consisting of He+ ion neutralization means and means 62 for exciting the helium atoms resulting from the neutralization of the He+ ions.

The neutralization of the He+ ions takes place in gaseous helium. The neutralization means 61 comprise a chamber 63 placed in an enclosure 59, on the path of primary beam 56, following the focusing thereof. Chamber 63 is maintained in enclosure 59 by means of a flange 64, which is perforated on either side, in order to maintain the same pressure of approximately $10^{-4}$ Pa on either side of said flange 64. The latter is joined to enclosure 59 by a clip 64a. Chamber 63 contains gaseous helium under a pressure of approximately $10^{-1}$ Pa, said gaseous helium being introduced into chamber 63 by a pipe 65. Chamber 63 has two facing openings 67 and 68 on two opposite sides of the chamber, said two openings being arranged in such a way that they are located on the path of primary beam 56. The dimensions of the two openings 67 and 68 are adapted to the size of the primary beam 56. A good vacuum is maintained in the remainder of enclosure 59, whilst limiting to the greatest possible extent the size of openings 67, 68 and whilst providing enclosure 59 with pumping means permitting very high pumping speeds in enclosure 59.

The means 62 for exciting the helium atoms resulting from the neutralization of the He+ ions comprise an electron source, like electron source 4 in FIG. 1, making it possible to bombard the helium atoms with electrons, in order to pass them into a metastable state. Thus, a beam 69 of helium atoms in a metastable state is obtained, said beam converging in accordance with angle $\alpha$. In order that the He+ ions are not exposed to floating electrical potentials, an electrical connection is formed between the perforated electrode 57 and the perforated electrode equipping the electron source 62.

The apparatus according to the invention also comprises means constituted by a light source 70 associated with an optical system 71 for producing a light beam 72, which diverges by an angle $\alpha$ from optical system 71. A mask 73, like mask 41 in FIG. 4, is placed behind the optical system 71 to modulate the intensity of light beam 72. The light emitted by source 70 has a wavelength of 0.260 $\mu$m. Source 70 and optical system 71 are positioned in such a way that the modulated intensity light beam 72 and the metastable helium atom beam 69 propagate in the same direction, but in opposite senses and also so that beams 69 and 72 coincide (which is possible in view of the fact that the convergence angle of 1 is equal to the divergence angle of the other).

Light source 70, optical system 71 and mask 73 are positioned outside enclosure 59, in order to simplify the production and use of the apparatus. Enclosure 59 is provided with an e.g. quartz porthole, to permit the passage of light beam 72. The latter interacts with the beam 69 of metastable He* atoms by ionizing the latter.

The apparatus according to the invention shown in FIG. 6 also comprises means 75 for deflecting the thus formed He+ ions. These means 75 are symbolized by a mixed line circle in FIG. 6 and e.g. comprise a magnet, thus producing a deflection magnetic field.

Figure 7:
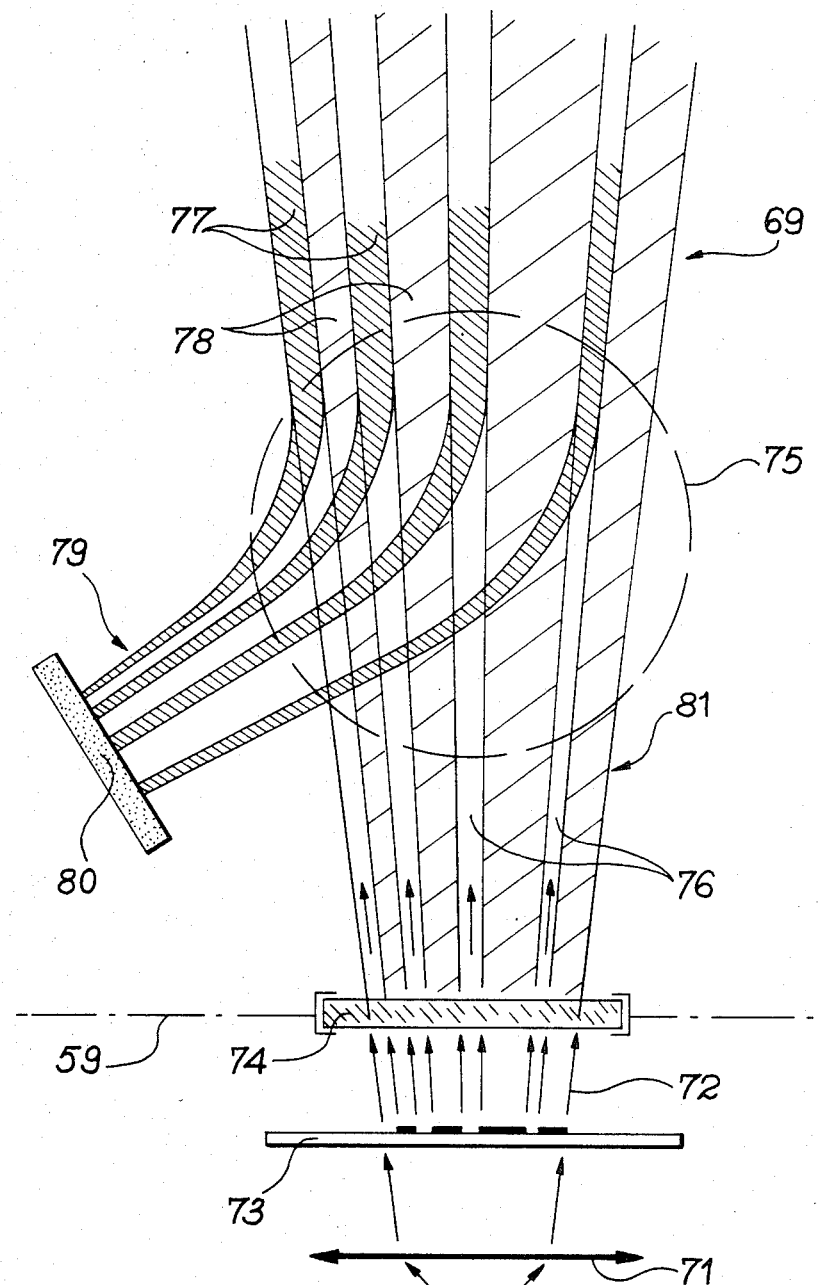
FIG. 7 a larger scale view of part of the apparatus of FIG. 6.

FIG. 7 shows on a larger scale, the area in which this deflection occurs. Light beam 72, whose intensity is spatially modulated by mask 73, comprises a plurality of subbeams 76, which ionize the metastable atoms of the metastable helium atom beams 69 encountered during their passage, thus creating He+ ion channels 77, separated by other channels 78, formed by He* metastable atoms not reached by the photons of light beam 72 and consequently remaining in the metastable state. Magnet 75 deflects the He+ ion formed, the paths of these metastable atoms remaining unchanged. Thus, a He+ ion beam 69 of spatially modulated density is obtained, which can be passed onto a target 80, such as an integrated circuit, in order to carry out there an ion implantation, or for sensitizing a resin deposited on said circuit, in order to form on the latter patterns which can be smaller than 1 $\mu$m. A beam 71 of spatially modulated density is also obtained and which is formed by He* atoms remaining in the metastable state, whereby said beam could also be used after ionizing and deflecting the He* atoms.

Preferably, the size of the patterns of mask 73, i.e. in the present case the size of the transparent regions separating the opaque regions of the mask, is chosen in such a way as to only cause a slight light diffraction. For this purpose, it is possible to use on mask 73 patterns having a size exceeding the wavelength of the light from light source 70, i.e. patterns of approximately 1 $\mu$m or larger in the present case, for which the light used has a wavelength of 0.260 $\mu$m. Despite this condition imposed on mask 73, the patterns produced on circuit 80 can be much smaller than the patterns of mask 73, in view of the convergence of the He+ ion beam 79, and which itself results from the convergence given to the primary beam 56 (FIG. 6). This convergence can be determined from the size of the motifs, which it is wished to produce on circuit 80.

Obviously, the apparatus according to the invention shown in FIG. 6 could be adapted to the use of a negative ion source. Moreover, the neutralization of the ions could also be carried out other than by contact with atoms of the same chemical species as said ions, e.g. by an electron flux having the same velocity as said ions.

The invention is not limited to obtaining beams of particles having a density spatially modulated in a continuous manner by masks having regions opaque to the light used and separated by regions transparent to said light. The invention also makes it possible to obtain beams of particles having a density which is continuously spatially modulated by using masks having a variable opacity, as a function of the considered points on these masks.

Masks permitting a discontinuous spatial modulation of the intensity of the light beams passing through them can, for example, be obtained by depositing an absorbent thin coating on a transparent substrate and by then removing the desired parts by well-known photolithography methods.

The masks permitting a continuous spatial modulation of the intensity of the light beams passing through them can, for example, be obtained by depositing an oblique coating on a transparent support, followed by photolithography, during which the etching of the deposited coating is interrupted before said coating totally disappears.

Obviously, a large number of particles, other than rare gas atoms, can be used in the invention. For example, it is possible to use a primary beam of mercury atoms, atomic mercury having two metastable levels, the first at 4.67 eV and the second at 5.46 eV, as well as an ionization level of 10.43 eV.

Finally, in an illustrative and non-limitative manner, it is possible to provide one example for realising the second embodiment of the process according to the invention. A beam of negative ions, e.g. a H− ion beam is produced. A beam of photons having an intensity which is appropriately spatially modulated, is supplied to said beam of negative ions, so as to selectively pass (in the spatial sense of the term) part of the negative ions into a neutral state (metastable or normal), by a so-called photodetachment reaction, the energy of the photons serving to break the bonds between the H atoms and the electrons added to the latter. The remaining H$^-$ ions are separated from the hydrogen atoms in the neutral state.

What is claimed is:

1. A process for obtaining beams of particles having a spatially modulated density, wherein it comprises passing the particles of a primary beam of particles in a first high-energy state $E_1$, so as to form the beam of particles in said first high-energy state $E_1$, selectively passing the particles in the first high-energy state $E_1$ to a second high-energy state $E_2$ with the aid of a light flux having a spatially modulated intensity, directed onto the beam of particles in said first high-energy state $E_1$, and separating the particles in the second high-energy state $E_2$ from particles in the first high-energy state $E_1$, so as to obtain a beam formed by particles in the first high-energy state $E_1$ and a beam formed from particles in the second high-energy state $E_2$, said beams being separate and having a spatially modulated density, wherein one of the said first and second high-energy states $E_1$ and $E_2$ is a long life high-energy state and wherein the other high-energy state is an ionized state, whose ionization state differs from that of the long life high-energy state.

2. A process according to claim 1, wherein the long life high-energy state is a metastable excited state.

3. A process according to claim 2, wherein the particles of the primary beam are electrically neutral and in their normal state, and wherein these particles are passed into said metastable excited state from their normal state by electron bombardment, the first high-energy state $E_1$ being constituted by said metastable excited state and the high-energy state $E_2$ then being the ionized state.

4. A process according to claim 2, wherein the particles of the primary beam are electrically charged and wherein these particles are passed into said metastable excited state by electron bombardment, after neutralizing the particles of the primary beam by charge exchange in a gas of particles of the same type, the first high-energy state $E_1$ being constituted by the metastable excited state and the second high-energy state $E_2$ then being the ionized state.

5. A process according to claim 1, wherein the ionized state is the first ionization state.

6. A process according to claim 1, wherein the particles which are then in the ionized state are separated from the particles in the long life high-energy state with the aid of at least one of the fields taken from the group including electrical fields and magnetic fields.

7. A process according to claim 1, wherein the intensity of the light flux is spatially modulated by passing said light flux through a mask.

8. A process according to claim 1, wherein the spatial modulation of the intensity of the light flux is obtained by a method based on the undulatory nature of light.

9. A process according to claim 8, wherein the modulated intensity light flux is obtained by directing towards the axis of the particle beam in the first high-energy state $E_1$, two beams of coherent light from the same primary light beam, whereby this takes place in a symmetrical manner with respect to the axis of the particle beam in said first high-energy state $E_1$, so as to obtain in this way alternate light and dark areas parallel to the axis of the particle beam in said first high-energy state $E_1$.

10. A process according to claim 1, wherein the particles are atoms of at least one rare gas.

11. An apparatus for obtaining beams of particles having a spatially modulated density, wherein it comprises means for producing a primary particle beam, means for passing the particles of said primary beam to a first high-energy state $E_1$, so as to form a particle beam in said first high-energy state $E_1$, means of producing a light flux formed from photons able to pass the particles in the first high-energy state $E_1$ to a second high-energy state $E_2$, and for directing this light flux into the particle beam in the first high-energy state $E_1$, means for spatially modulating the intensity of the light flux, interposed between the means for producing and directing said light flux and the particle beam in the first high-energy state $E_1$, so as to selectively pass the particles in the first high-energy state $E_1$ to the second high-energy state $E_2$, and means for separating the particles in the second high-energy state $E_2$ from the particles in the first high-energy state $E_1$, so as to obtain a beam formed from particles in the first high-energy state $E_1$ and a beam formed from particles in the second high-energy state $E_2$, said beams being separate and having a spatially modulated density, one of the first and second high-energy states $E_1$ and $E_2$ being a long life high-energy state and the other high-energy state being an ionized state, whose ionization state differs from that of the long life high-energy state.

12. An apparatus according to claim 11, wherein it comprises means for producing a primary particle beam, means for passing the particles of said primary beam to a long life high-energy state, so as to form a particle beam in said long life high-energy state means for producing a light flux formed from photons able to ionize the particles in said long life high-energy state and for directing this light flux onto the particle beam in said long life high-energy state, means for spatially modulating the intensity of said light flux, interposed between the means for producing and directing the light flux and the particle beam in said long life high-energy state, so as to selectively pass the particles in said long life high-energy state into an ionized state, and means for separating the particles in said ionized state from the particles remaining there in the long life high-energy state, so as to obtain a beam formed from particles in the ionized state and a beam formed from particles remaining in the long life high-energy state, said beams being separate and having a spatially modulated density, the ionized state having an ionization state differing from that of the long life high-energy state.

13. An apparatus according to claim 12, wherein the light flux is constituted by at least one light beam, which directed towards the beam of particles in the long life high-energy state and transversely with respect thereto.

14. An apparatus according to claim 12, wherein the light flux is a light beam, wherein the latter as well as the beam of particles in the long life high-energy state are colinear and have opposite propagation senses and wherein the apparatus also successively has ionization means, acceleration means for deflecting the beam of particles remaining in said long life high-energy state.

15. An apparatus according to claim 12, wherein the light flux is a light beam, the particle beam in the long life high-energy state and the light beam propagating in the same direction and in opposite senses, wherein the particle beam in said long life high-energy state is rendered convergent in accordance with an angle $\alpha$, the light beam being rendered divergent according to the same angle α and also coincides with the particle beam in the long life high-energy state, and wherein the separation means comprise means for deflecting the particles in said ionized state.

16. An apparatus according to claim 15, wherein the means for spatially modulating the intensity of the light beam consist of a mask provided with patterns, whose size is such that they only lead to a slight light diffraction.

17. An application of the process according to claim 1 to ion implantation and etching.

* * * * *